(12) United States Patent
Feldstein et al.

(10) Patent No.: US 9,000,308 B2
(45) Date of Patent: Apr. 7, 2015

(54) HI-DEFINITION MULTIMEDIA INTERFACE GASKET

(75) Inventors: Wendy Feldstein, Old Tappan, NJ (US); William Rehak, Oradell, NJ (US)

(73) Assignee: Crestron Electronics Inc., Rockleigh, NJ (US)

( * ) Notice: Subject to any disclaimer, the term of this patent is extended or adjusted under 35 U.S.C. 154(b) by 314 days.

(21) Appl. No.: 13/534,234

(22) Filed: Jun. 27, 2012

(65) Prior Publication Data

US 2012/0325546 A1   Dec. 27, 2012

Related U.S. Application Data

(60) Provisional application No. 61/501,421, filed on Jun. 27, 2011.

(51) Int. Cl.
*H05K 9/00* (2006.01)

(52) U.S. Cl.
CPC .................................. *H05K 9/0058* (2013.01)

(58) Field of Classification Search
CPC .................................................... H05K 9/0058
USPC ......................................................... 174/358
See application file for complete search history.

(56) References Cited

U.S. PATENT DOCUMENTS

| | | |
|---|---|---|
| 2,477,267 A | 7/1949 | Robinson |
| 3,969,572 A | 7/1976 | Rostek |
| 4,236,779 A | 12/1980 | Tang |
| 4,239,318 A | 12/1980 | Schwartz |
| 4,512,623 A | 4/1985 | Tomsa |
| 4,703,133 A | 10/1987 | Miller |
| 4,857,668 A | 8/1989 | Buonanno |
| 5,578,790 A | 11/1996 | Peregrim |
| 5,628,653 A | 5/1997 | Haas et al. |
| 6,235,986 B1 * | 5/2001 | Reis et al. ..................... 174/358 |
| 6,416,031 B1 | 7/2002 | Billman |
| 6,800,805 B2 * | 10/2004 | Deguchi ........................ 174/358 |
| 6,818,822 B1 | 11/2004 | Gilliland et al. |
| 6,932,640 B1 | 8/2005 | Sung |
| 7,270,570 B1 * | 9/2007 | Hamner et al. .......... 439/607.04 |
| 7,557,306 B2 * | 7/2009 | Chen et al. .................... 174/382 |
| 7,763,810 B2 * | 7/2010 | van Haaster .................. 174/357 |
| 7,804,696 B2 * | 9/2010 | Kim .............................. 361/818 |
| 7,952,890 B2 | 5/2011 | Myers et al. |
| 2006/0036788 A1 | 2/2006 | Galang et al. |
| 2006/0272855 A1 * | 12/2006 | Rutherford et al. ........... 174/350 |
| 2011/0188227 A1 * | 8/2011 | Fukunaga et al. ............ 361/818 |

* cited by examiner

*Primary Examiner* — William H Mayo, III
*Assistant Examiner* — Hiram E Gonzalez
(74) *Attorney, Agent, or Firm* — Crestron Electronics Inc.

(57) ABSTRACT

A gasket comprises a main portion having first and second ends, a parallel leg extending perpendicularly from each of the first and second ends, and a step portion extending perpendicularly from each of the other end of the legs. The main portion and leg form an opening that is sized and dimensioned to receive a shell of a connector. A layer of nickel plated metalized nylon fabric wrapped over polyurethane foam. One side of the layer bonds to the interior surfaces of the main portion and leg that form the opening and the other side of the layer is adapted to urge against the shell of the HDMI connector. A section of the layer extends beyond the widths of the main and legs. The section is adapted to urge against a faceplate to maintain an electrical-conductive path between the shell of the HDMI connector and the surface of the faceplate.

21 Claims, 11 Drawing Sheets

FIG. 11

HI-DEFINITION MULTIMEDIA INTERFACE GASKET

BACKGROUND OF THE INVENTION

1. Technical Field

The present invention relates generally to a gasket. More particularly, the invention relates to a radio frequency and electromagnetic interference gasket for a Hi-Definition Multimedia Interface (HDMI) connector.

2. Background Art

HDMI is a transmission interface developed for next generation multimedia audio/video systems including DVD players, game box converters, TV boxes, etc. The maximum transmission speed of an HDMI interface can be as high as 5 Gb/s. In addition to a video signal, an HDMI interface can simultaneously transmit an 8-channel audio signal. Because HDMI is practical for transmitting digital data without compression, it effectively reduces signal interference and attenuation due to conversion between digital signal and analog signals. An HDMI connector is a small-size connector developed following the step of SATA (Serial AT attachment) interface connector.

As operating frequencies increase, reducing Electromagnetic interference (EMI) becomes more important. Although EMI affects different types of cable connectors, HDMI connectors are particularly susceptible to EMI due to their high operating frequency. EMI shielded cables and connector assemblies are frequently used for the transmission of data signals between programmable instruments, such as computers and the like, as well as in other environments in which electrical and electromagnetic radiation can be expected to interfere with the electrical signals carried by the interconnecting cables and connector assemblies. Shielding has been used for years in electrical connectors to keep unwanted radio frequency and RFI/EMI and electromagnetic pulses (EMP) from interfering with signals carried by contacts in connectors. In a simple case, EMI is reduced by mounting or connecting the HDMI connector to a printed circuit board, which is a ground plane. When the shell of the HDMI connector is electrically referenced to the ground plane, the shell of the HDMI connector itself may become a significant source of EMI energy and contribute EMI energy to the shield of the inserted video cable.

Accordingly, it is the object of the present invention to provide a gasket on a connector, such as a HDMI connector, that reduces EMI.

SUMMARY OF THE INVENTION

It is to be understood that both the general and detailed descriptions that follow are exemplary and explanatory only and are not restrictive of the invention.

DISCLOSURE OF INVENTION

Principles of the invention provide an RFI, EMI and/or EMP gasket for an HDMI connector. For example, in a first aspect of the invention, an electromagnetic gasket for use on an HDMI connector comprises a main portion having first and second ends, a substantially parallel leg extending perpendicularly from each of the first and second ends, and a step portion extending perpendicularly from each of the other end of the legs. The main portion and leg form an opening that is sized and dimensioned to receive a shell of an HDMI connector. A layer of nickel plated metalized nylon fabric wrapped over polyurethane foam has one side being bond to the interior surfaces of the main portion and leg that form the opening and the other side of the layer is adapted to urge against the shell of the HDMI connector. A section of the layer extends beyond the widths of the main portion and legs. The section is adapted to urge against a surface of a faceplate to maintain an electrical-conductive path between the shell of the HDMI connector and the surface of the faceplate.

In a second aspect of the invention, an electromagnetic gasket for use on an HDMI connector comprises a main portion having first and second ends, a substantially parallel leg extending perpendicularly from each of the first and second ends, and a step portion extending perpendicularly from each of the other end of the legs. Each step portion includes a concentric opening for a mechanical fastener to couple the gasket to a circuit board. The main portion and legs form an opening that is sized and dimensioned to receive a shell of an HDMI connector. A layer of nickel plated metalized nylon fabric is wrapped over polyurethane foam, wherein one side of the layer bonds to the interior surfaces of the main portion and legs that form the opening and the other side of the layer is adapted to urge against the shell of the HDMI connector. A section of the layer extends beyond the widths of the main portion and legs. The section is adapted to urge against a surface of a faceplate to maintain an electrical-conductive path between the shell of the HDMI connector and the surface of the faceplate.

The present invention seeks to overcome or at least ameliorate one or more of several problems, including but not limited to: preventing EMI energy to be radiated by the shield of the HDMI cable.

BRIEF DESCRIPTION OF DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

BRIEF DESCRIPTION OF THE SEVERAL VIEWS OF THE DRAWINGS

LIST OF REFERENCE NUMBERS FOR THE MAJOR ELEMENTS IN THE DRAWING

The following is a list of the major elements in the drawings in numerical order.
- 100 electromagnetic gasket
- 102 connector shell of a connector (e.g., HDMI connector 105)
- 104 leg
- 107 opening/passageway
- 110 main portion of the gasket 100
- 111*a* parts of the section 116
- 111*b* parts of the section 116
- 111*c* parts of the section 116
- 112 layer
- 105 HDMI connector
- 106 step portion of the gasket 100
- 116 section
- 120 opening of the step portion 106
- 135 top surface of the shell 102
- 145 side surfaces of the shell 102
- 146 slit
- 160 faceplate
- 175 circuit board
- 185 surface
- 190 chasis

DETAILED DESCRIPTION OF THE INVENTION

Definitions

"EMI" and "RFI" both refer to unwanted electromagnetic radiation signals that can potentially interfere with other signals. For purposes of brevity and consistency, this specification will use the term "EMI" when referring to such interference.

Mode(s) for Carrying Out the Invention

The present invention relates to a radio frequency and electromagnetic interference gasket for a Hi-Definition Multimedia Interface (HDMI) connector. One of the hardest challenges to overcome when attempting to achieve EMI compliance of an electronic device housed in an enclosure with connecting cables is to control the emissions of the cables. In order to overcome such challenge, a method to ground the shields of such cables to a suitable point where EMI energy is not present, or is very low, is necessary. For electronic circuits housed in metallic (conductive) enclosures, the enclosure surface itself is a grounding point. The outer surface of the enclosure is better, but the inner surface in general yields acceptable results.

The present disclosure provides a gasket (or grounding spring "clip") to provide a direct grounding path from the shield of the video cable to the enclosure of the equipment. The mounting points of the HDMI connector shell is not electrically connected to the circuit board ground plane but rather, for example, to a surface of an enclosure.

Figure 1:
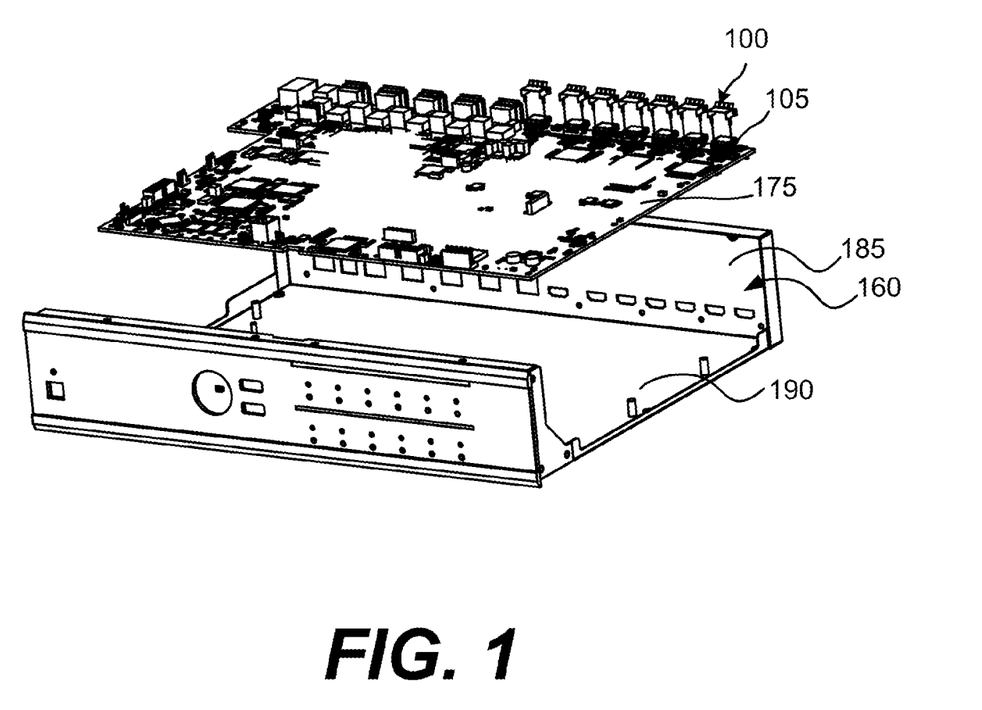
FIG. 1 is an exploded perspective view of an electromagnetic gasket for use on an HDMI connector, which is mounted onto a printed circuit board in accordance with an illustrative embodiment of the present invention

FIG. 1 is an exploded perspective view of an illustrative electromagnetic gasket 100 with an HDMI connector 105 on an electronic printed circuit board 175 in accordance with one embodiment of the invention. The circuit board 175 may be installed onto a chassis 190 having a faceplate 160. The gasket 100 interfaces to a surface 185 of the faceplate 160.

Figure 2:
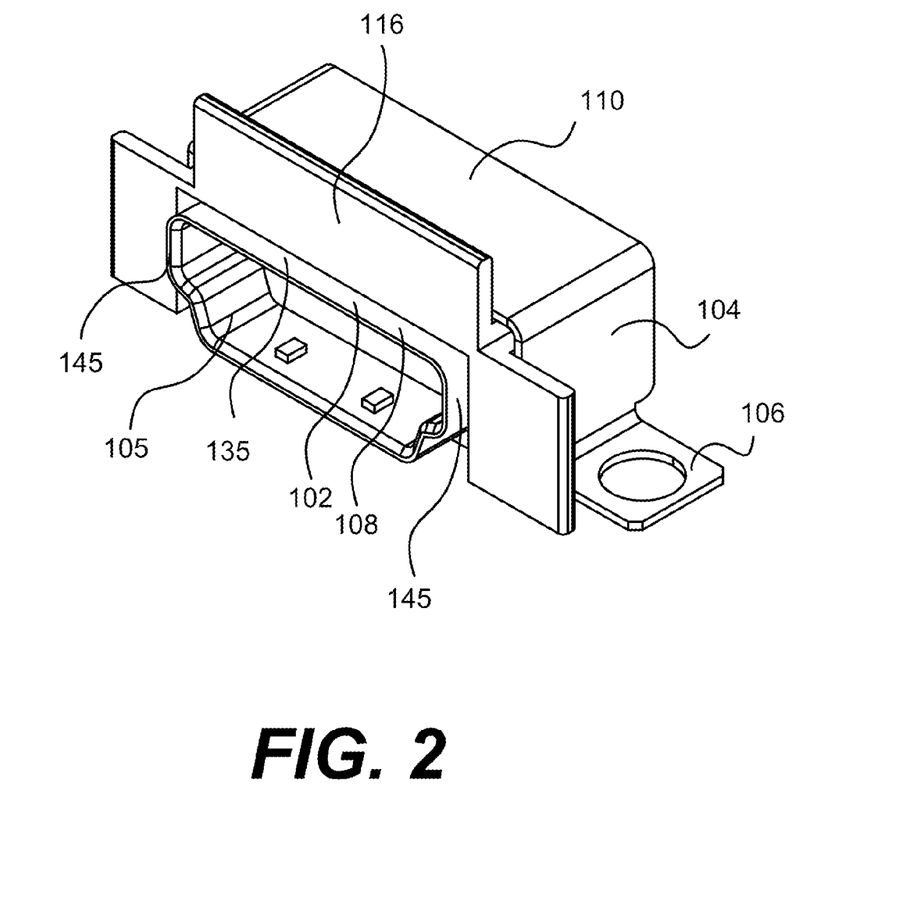
FIG. 2 is a perspective view of an electromagnetic gasket coupled to an HDMI connector in accordance with an illustrative embodiment of the present invention.

FIG. 2 is a perspective view of the gasket 100 attached to a shell 102 of an HDMI connector 105. The gasket 100 is formed from a single sheet into a substantially U-shaped piece. The gasket 100 has a main portion 110 with a first and second ends. A substantially parallel leg 104 extends perpendicularly from each of the first and second ends of the main portion 110. A step portion 106 extends perpendicularly from each of the other end of the legs 104. The main portion 110 and legs 104 are sized and dimensioned to form an opening or passageway 107 to receive the shell 102 of an HDMI connector 105.

Figure 3:
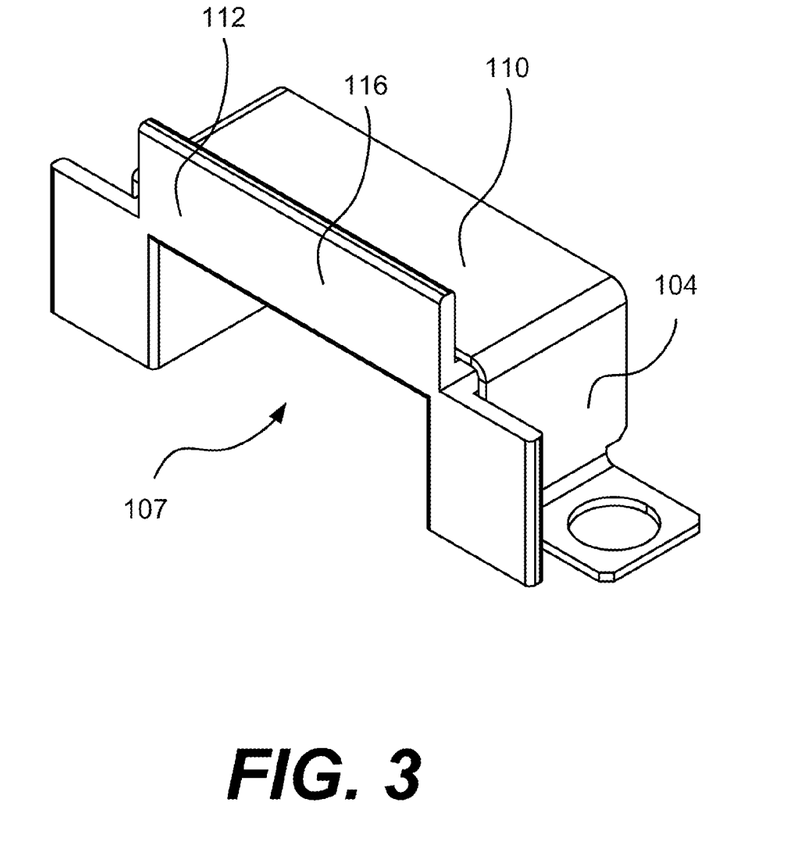
FIG. 3 is a front perspective view of the electromagnetic gasket in accordance with an illustrative embodiment of the present invention.
Figure 4:
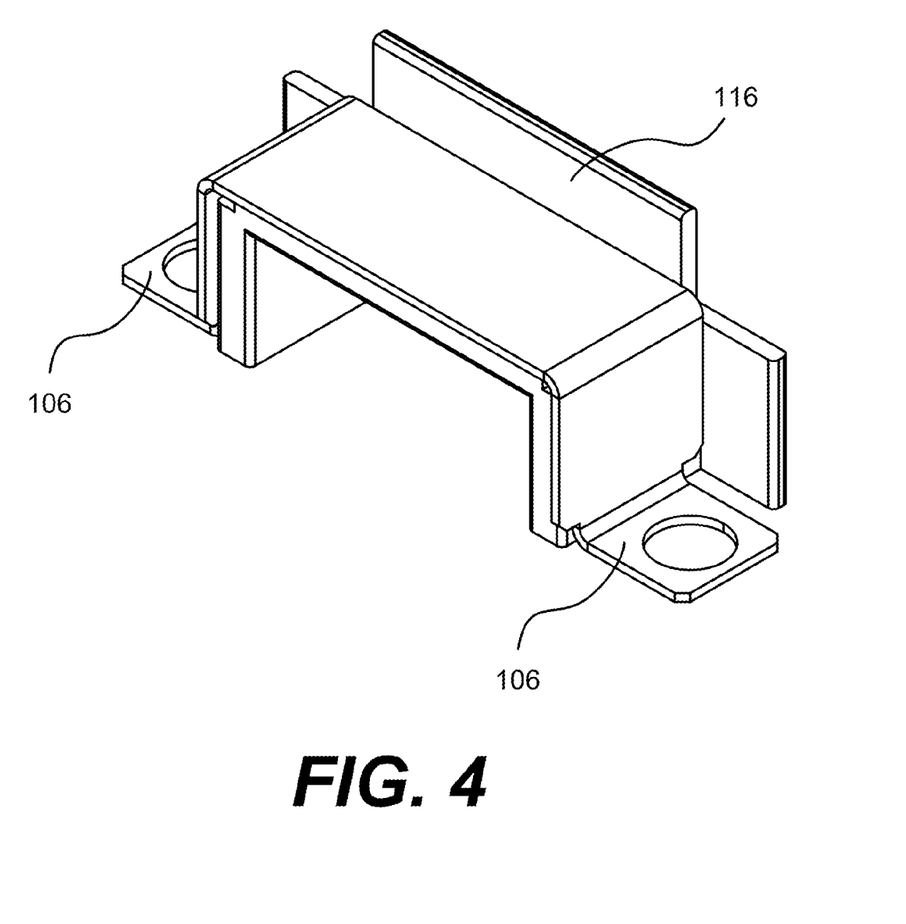
FIG. 4 is a back perspective view of the electromagnetic gasket in accordance with an illustrative embodiment of the present invention.
Figure 5:
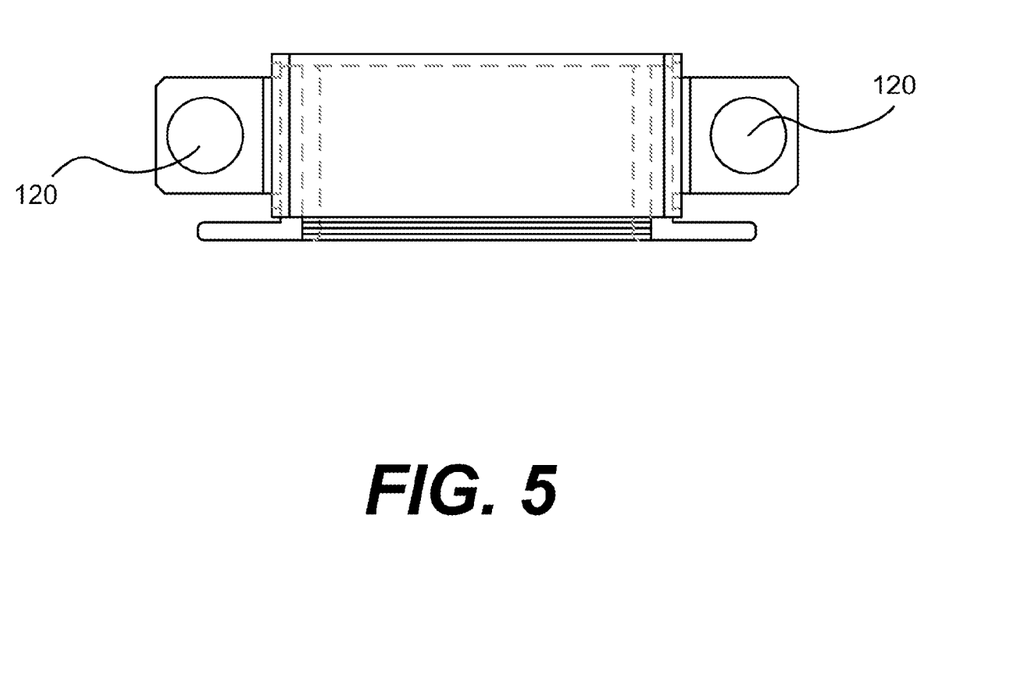
FIG. 5 is a top planar view of the electromagnetic gasket in accordance with an illustrative embodiment of the present invention.
Figure 6:
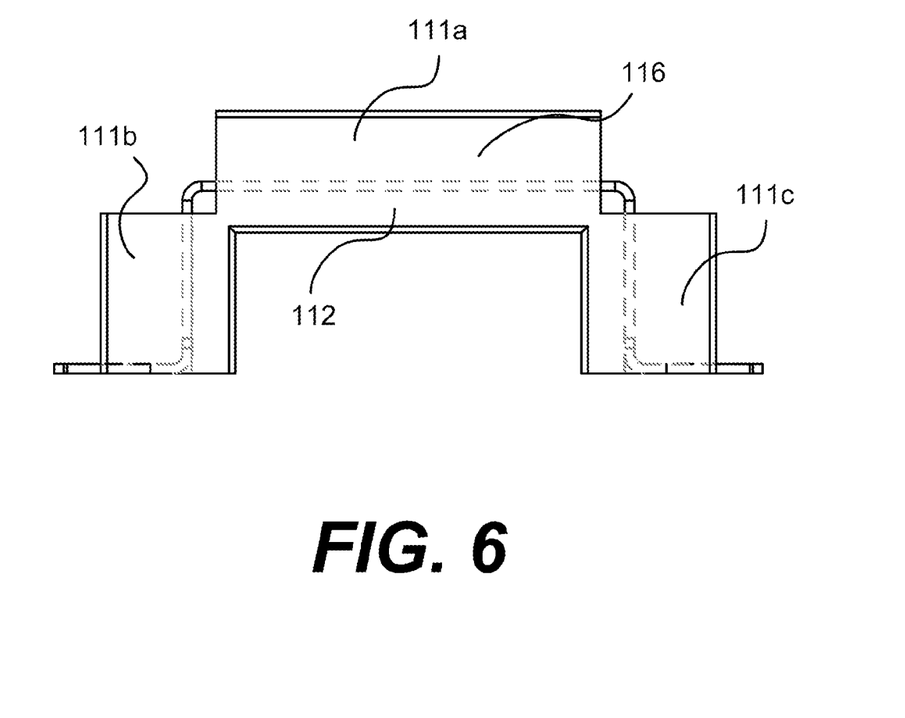
FIG. 6 is a front planar view of the electromagnetic gasket in accordance with an illustrative embodiment of the present invention.
Figure 7:
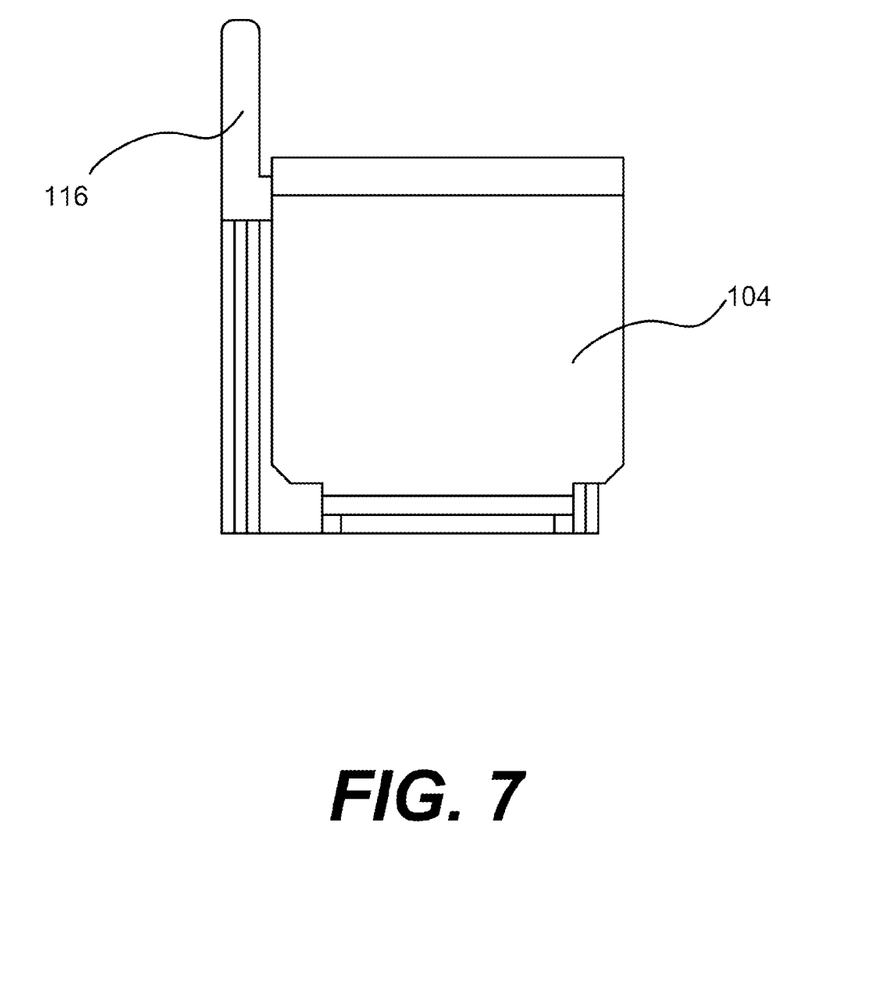
FIG. 7 is a right planar view of the electromagnetic gasket in accordance with an illustrative embodiment of the present invention.
Figure 8:
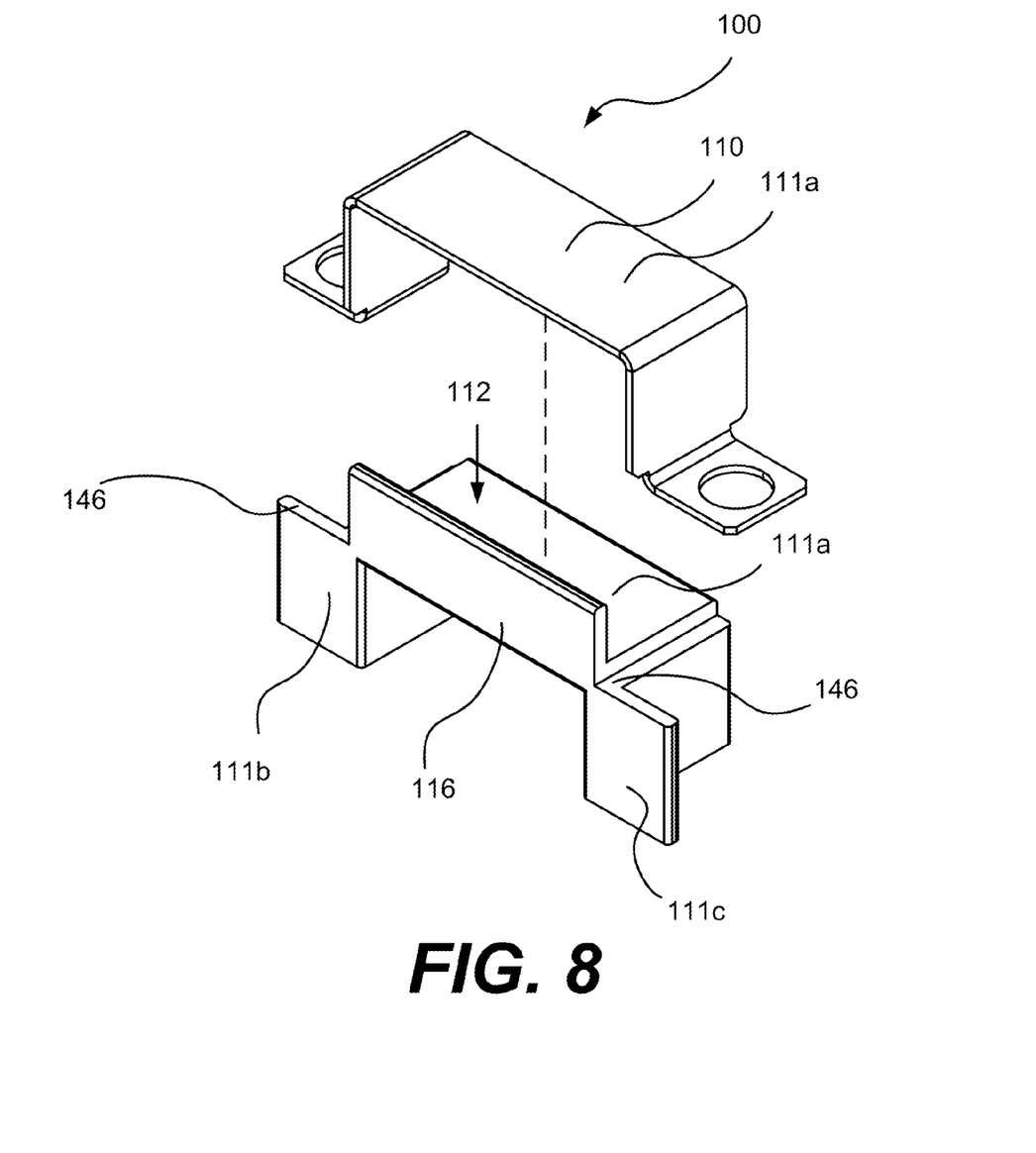
FIG. 8 is an exploded view of the electromagnetic gasket in accordance with an illustrative embodiment of the present invention.

Referring to FIG. 3, the gasket 100 includes a layer 112, which is a resilient polyurethane foam core and wrapped with a durable high performance nickel plated metalized nylon conductive fabric. One side of the layer 112 bonds to the interior surfaces of the main portion 110 and legs 104 that form the opening 107 for receiving the shell 102 of the HDMI connector 105. The layer 112 can be bonded by an adhesive material or double-sided conductive tape. The other side of the layer 112 is adapted to urge against the shell 102 of the HDMI connector 105. The layer 112 has a section 116 that extends beyond the widths of the main portion 110 and legs 104. The section 116 is adapted to urge against a surface 185 of a faceplate 160 to maintain an electrical-conductive path between the shell 102 of the HDMI connector 105 and the surface 185 of the faceplate 160. In other words, the section 116 is compressible against the surface 185 of the faceplate 160 to maintain an electrical-conductive path. The layer 112 is highly flame retardant. Section 116 of the layer 112 is independently flexible, and thus can accommodate non-uniform thicknesses of the surface 185 of the faceplate 160. Some faceplates may have uneven surfaces and therefore the gasket 100 can accommodate such uneven surfaces. The section 116 is able to transition between a non-flexed state and a flexed state. The flexed state is when the section 116 biases the surface 185 of the faceplate 160 and the non-flexed state is when the section 116 does not apply a force onto the surface 185. It should be understood that the layer 112 can be of another material that controls electromagnetic interferences and can operate at higher frequencies.

The electromagnetic gasket 100 is mounted or connected onto a connector shell 102 of a connector (e.g., an HDMI connector 105), which in turn, is mounted onto a circuit board 175. In order to provide a direct grounding path from the shield of the video cable (not shown) to the enclosure of the equipment such as via a surface 185 of the faceplate 160, the mounting points of the HDMI connector shell 102 connects electrically to the circuit board ground plane. In other words, the gasket 100 mounts on the shell 102 in such a manner that there is direct contact with the connector shell 102 and the surface 185 of the faceplate 160 surrounding the connector opening 107. The return electrical path of the video cable shield is as follows: the shield braid or foil of the video cable (not shown) connects to the shell 102 of the HDMI connector 105, which in turn, is connected with the shell 102 of the mating HDMI connector 105 in the enclosure of the HDMI connector, which in turn, connects to the enclosure metal or faceplate 160 via the gasket 100. The gasket 100 does not rely on the "frame ground" trace located at the edge of the circuit board 175. As such, the gasket 100 isolates the HDMI shell 102 from the main board circuit ground altogether. Moreover, gasket 100 is easy to install and remove during the manufacturing process and is highly reproducible.

FIGS. 3-8 are various view of the electromagnetic gasket 100. The gasket 100 may be formed from a single sheet. The gasket 100 has a section 116 of the layer 112 that extends beyond the width of the main portion 110 and legs 104. The section 116 is bent substantially perpendicular to the surface 185 of the faceplate 160. The flexibility of the section 116 allows it to deflect at assembly and compress against the surface 185 of the faceplate 160 in such a manner that there may be a "gas-tight" connection. When the faceplate 160 is constructed of oxidizing material, such as Aluminum, which creates a poor contact over time, a "gas-tight" connection is important to ensure a reliable connection over time. The resilient section 116 urge or compresses against the surface 185 of the faceplate 160 to create a "gas-tight" connection because of, in part, the section's 116 shape and dimensions (e.g., bend radii). The resilient section 116 includes a slit 146 at each of the first and second ends of the main portion 110 that intersects with the legs 104. As such the section 116 has three parts 111a, 111b, 111c that compresses against the surface 185 of the faceplate 160.

The gasket 100 is approximately 0.96 inches in length, approximately 0.30 inches in width, and approximately 0.45 inches in height. The main portion 110, legs 104, and step portions 106 have the same width of approximately 0.200 inches. The length of the step portion 106 is approximately 0.96 inches. The height of each leg is approximately 0.30 inches. It should be understood that other dimensions are possible.

The HDMI connector 105 is inserted through and/or into the opening/passageway 107. When the gasket 100 is inserted through the HDMI connector 105 and in turn the gasket 100 and HDMI connector 105 are mounted onto the circuit board 175, the layer 112 compresses against the outside surfaces of the top 135 and sides 145 surfaces of the shell 102 of the HDMI connector 105. The gasket 100 includes a concentric opening 120 at each step portion 106. Any type of mechanical fastener can be used to mount the gasket 100 to the circuit board 175 such as screws. The step portions 106 of the gasket 100 do not make an electrical contract with the circuit board 175.

The gasket 100 may be constructed from any suitable material operative to gasket the connector 105 and/or other components from electromagnetic interference (e.g., from other components of the electronic device). In one embodiment, gasket 100 (e.g., main portion 110, legs 104, and step portions 106) is constructed from beryllium copper alloy and plated with tin resulting in a uniform thickness of approximately, for example, 0.004 inches. In other embodiments, the gasket 100 may be constructed from an electrically conductive material such as, for example, stainless steel, steel, brass, silver, aluminum, and/or other conductive materials.

Gasket 100 may be placed on the shell 102 of the HDMI connector 105. The HDMI connector 105, in turn, is placed on any suitable portion of the circuit board 175 that emits EMI or is susceptible to EMI. The gasket 100 can be installed or removed individually onto/from the circuit board 175 for easy access to the HDMI connector 105 (e.g., for repair) without disturbing the HDMI connector 105 and/or other components that may be sensitive to interference.

Referring back to FIG. 2, once the HDMI connector 105 is installed onto the circuit board 175 with the faceplate 160, the section 116 flexes and makes contact with the faceplate 160 for a ground connection. The gasket 100 provides a direct grounding path from the shield of the video cable (not shown) to the surface 185 of the faceplate 160, which may be an enclosure of equipment. The HDMI connector shell 102 is not connected electrically to the circuit board 175 ground plane, but rather to the faceplate 160. The resilient section 116 applies a biasing force against the surface 185 of the faceplate 160 to create a "gas-tight" ground connection. The section 116 may be flexibly biased towards the surface 185 of the faceplate 160 such that the section 116 may deflect when they are placed against the surface 185 of the faceplate 160, thus creating tension onto the surface 185. If the section 116 is removed from installation, the section 116 may bend back to its normal or non-tensed position or may take a minimal set but will remain functional. In other words, the section 116 maintains the same bent radius even after being bent to another radius when the gasket 100 is installed. This allows the gasket 100 to be re-usable instead of being a one-time use component. Further, since the gasket 100 is installed onto the shell 102 of the HDMI connector 105 separately, the gasket 100 can be sold as an off the shelf product without the HDMI connector 105. Moreover, if the HDMI connector 105 is damaged, the reusable gasket 100 can be reinstalled onto another HDMI connector without having to throw away a gasket that is integrated with an HDMI connector. This saves raw material cost by not wasting an otherwise functional gasket just because of a bad connector.

Before coupling the gasket 100 to the shell 102 of the connector 105, the gasket 100 with the section 116 slides away or towards the surface 185 of the faceplate 160 so as to vary the amount of force the section 116 applies to the surface 185. This enables the gasket 100 to accommodate varying faceplate 160 thicknesses while the section 116 maintains contact with the surface 185 of the faceplate 160.

Figure 9:
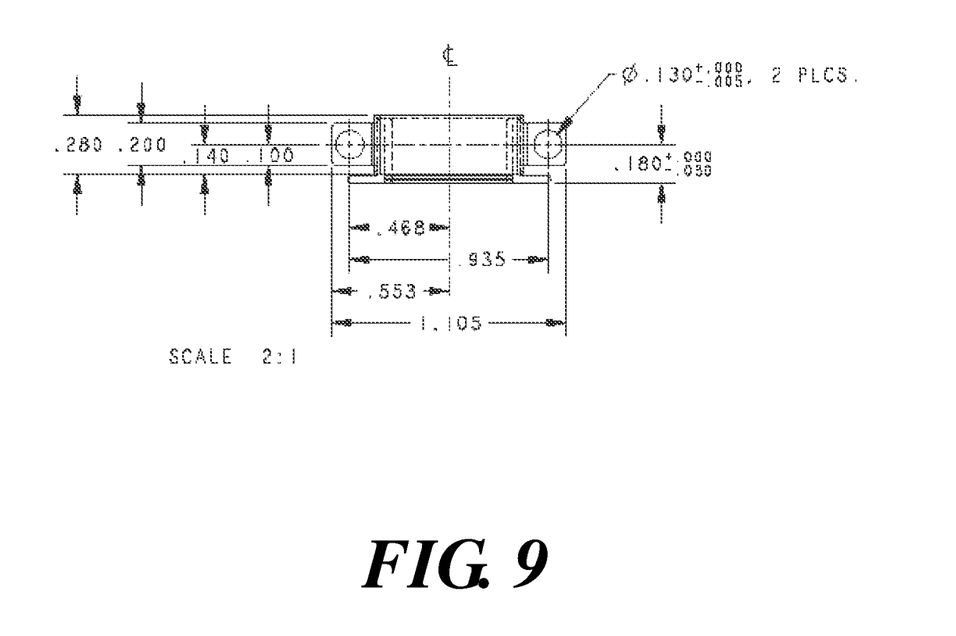
FIG. 9 is a top planar view of the electromagnetic gasket with dimensions in accordance with an illustrative embodiment of the present invention.
Figure 10:
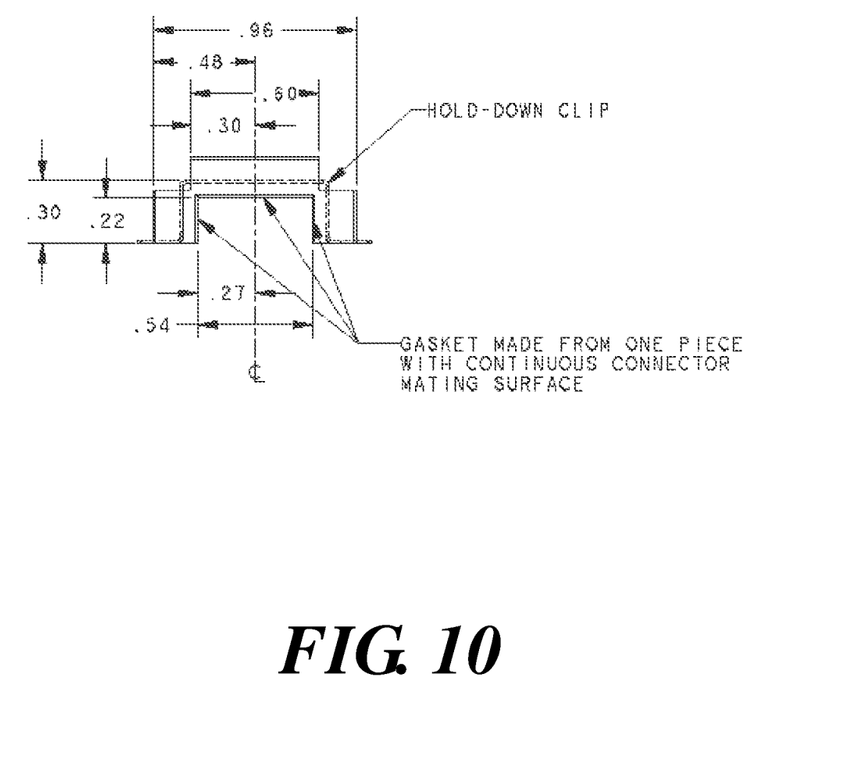
FIG. 10 is a front planar view of the electromagnetic gasket with dimensions in accordance with an illustrative embodiment of the present invention.
Figure 11:
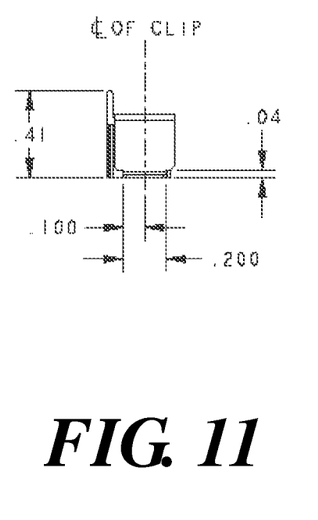
FIG. 11 is a right planar view with dimensions of the electromagnetic gasket in accordance with an illustrative embodiment of the present invention.

The dimensions of the gasket 100 vary depending on the application. FIGS. 9-11 are drawings with dimensions showing one embodiment of gasket 100. It should be understood that the dimensions are only an example and that other dimensions are suitable to accommodate an HDMI connector. Further, the dimensions can vary to accommodate other types of connectors (e.g., RJ45 cable connector), quantity of connectors (e.g., multiple HDMI connectors), and a combination of connectors (e.g., RJ45 and HDMI connectors).

INDUSTRIAL APPLICABILITY

To solve the aforementioned problems, the present invention is a unique device for gasketing radio frequency and EMI on an electronic device.

LIST OF ACRONYMS USED IN THE DETAILED DESCRIPTION OF THE INVENTION

The following is a list of the acronyms used in the specification in alphabetical order.
EMI Electromagnetic interference
EMP Electromagnetic pulses
RF Radio Frequency Alternate Embodiments Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An electromagnetic gasket (100) for use with a video connector, comprising:
   (a) a main portion (110) having first and second ends;
   (b) substantially parallel legs (104) extending perpendicularly from each of the first and second ends;
   (c) a step portion (106) extending perpendicularly from each of the other end of the legs, wherein
      the main portion and legs form an opening (107) that is sized and dimensioned to receive a shell (102) of the video connector (105); and
   (d) a layer (112) of nickel plated metalized nylon fabric wrapped over polyurethane foam, wherein
      one side of the layer bonds to the interior surfaces of the main portion and leg that form the opening and the other side of the layer is adapted to urge against the shell of the video connector, wherein
      a section (116) of the layer extends beyond the widths of the main portion and legs, wherein the section is adapted to urge against a surface (185) of a faceplate (160) to maintain an electrical-conductive path between the shell of the video connector and the surface of the faceplate.

2. The gasket of claim 1, wherein
the gasket is configured to be inserted through the video connector in such a manner that the layer is adapted to compress against the outside surfaces of top (135) and two sides (145) of the shell of the video connector.

3. The gasket of claim 1, wherein
the section of the layer includes a slit (146) at each of the first and second ends of the main portion that intersects with the legs.

4. The gasket of claim 1, wherein
the section the layer is adapted to connect electrically the surface of the faceplate to the shell of the video connector to isolate the video connector from a circuit board (175).

5. The gasket of claim 1, wherein
each step portion includes a concentric opening (120) for a mechanical fastener to couple the gasket to a circuit board (175).

6. The gasket of claim 1, wherein
the main portion, legs, and step portions are formed from a single sheet of metal.

7. The gasket of claim 1, wherein
the main portion, legs, and step portions have the same width of approximately 0.200 inches.

8. The gasket of claim 1, wherein
the length of the step portion being 0.96 inches.

9. The gasket of claim 1, wherein
the height of each leg being 0.30 inches.

10. The gasket of claim 1, wherein
the main portion, legs, and step portions are coated with tin.

11. The gasket of claim 1, wherein
the step portions do not make an electrical contact with a circuit board (175).

12. The gasket of claim 1, wherein
the section of the layer is flexible.

13. The gasket of claim 1, wherein
the section of the layer is able to transition between a non-flexed state and a flexed state, wherein
the flexed state is when the section biases the surface of the faceplate and the non-flexed state is when the section has no force being applied.

14. The gasket of claim 1, wherein
the gasket is adapted to slideably mount on the video connector through the opening after the video connector is mounted on a circuit board (175) in such a manner that the section maintains contact with the surface of the faceplate, thereby accommodating various thicknesses of the faceplate.

15. The gasket of claim 1, wherein
the gasket is approximately 0.96 inches in length, 0.30 inches in width, and 0.45 inches in height.

16. The gasket of claim 1, wherein
the gasket is used with a high definition multimedia interface (HDMI) connector.

17. An electromagnetic gasket (100) for use with a video connector, comprising:
   (a) a main portion having first and second ends;
   (b) substantially parallel legs extending perpendicularly from each of the first and second ends;
   (c) a step portion extending perpendicularly from each of the other end of the legs, wherein
      each step portion includes a concentric opening for a mechanical fastener to couple the gasket to a circuit board (175); and wherein
      the main portion and legs form an opening that is sized and dimensioned to receive a shell of the video connector; and
   (d) a layer (112) of nickel plated metalized nylon fabric wrapped over polyurethane foam, wherein
      one side of the layer bonds to the interior surfaces of the main portion and legs that form the opening and the other side of the layer is adapted to urge against the shell of the video connector, wherein
      a section (116) of the layer extends beyond the widths of the main portion and legs, wherein
      the section is adapted to urge against a surface (185) of a faceplate (160) to maintain an electrical-conductive path between the shell of the video connector and the surface of the faceplate.

18. The gasket of claim 17, wherein
the gasket is configured to be inserted through the video connector in such a manner that layer is adapted to urge against the outside surfaces of top (135) and two sides (145) of the shell of the video connector.

19. The gasket of claim 17, wherein
the gasket is approximately 0.96 inches in length, 0.30 inches in width, and 0.45 inches in height.

20. The gasket of claim 17, wherein
the section is adapted to connect electrically the surface of the faceplate to the shell of the video connector to isolate the video connector from the circuit board.

21. The gasket of claim 17, wherein
the gasket is used with a high definition multimedia interface (HDMI) connector.

* * * * *